United States Patent [19]

Takahashi

[11] Patent Number: 5,526,093
[45] Date of Patent: Jun. 11, 1996

[54] EXPOSURE APPARATUS AND METHOD FOR A SEMICONDUCTOR WAFER

[75] Inventor: Kazuhiro Takahashi, Utsunomiya, Japan

[73] Assignee: Canon Kabushiki Kaisha, Tokyo, Japan

[21] Appl. No.: 274,322

[22] Filed: Jul. 13, 1994

[30] Foreign Application Priority Data

Jul. 15, 1993 [JP] Japan ..................................... 5-175502

[51] Int. Cl.⁶ ............................ G03B 27/42; H01L 21/02
[52] U.S. Cl. ................................... 355/53; 355/68; 355/69
[58] Field of Search .................................. 355/53, 68, 69; 346/108

[56] References Cited

U.S. PATENT DOCUMENTS 4,422,083  12/1983  Neumann et al. ....................... 346/108
4,750,161  6/1988  Takeuchi et al. ......................... 369/45

OTHER PUBLICATIONS

Buckley, et al., "Step and Scan: A Systems Overview of a New Lithography Tool," SPIE; Optical/Laser Microlithography II, vol. 1088, 1989, pp. 424 through 433.

*Primary Examiner*—Fred L. Braun
*Attorney, Agent, or Firm*—Fitzpatrick, Cella, Harper & Scinto

[57] ABSTRACT

An exposure apparatus including a scanner for scanning a substrate to be exposed with an exposure beam; and an exposure amount controller for controlling an amount of exposure by the exposure beam in accordance with a position on the substrate. An exposure apparatus including a scanner for scanning a substrate to be exposed with an exposure beam; a detector for detecting a distribution of a film thickness of a radiation sensitive layer on the substrate; and an exposure amount changing controller for controlling an amount of exposure by the exposure beam in accordance with the film thickness distribution.

40 Claims, 10 Drawing Sheets

F I G. 1

ILLUMINATION AREA

EXPOSURE APPARATUS AND METHOD FOR A SEMICONDUCTOR WAFER

FIELD OF THE INVENTION AND RELATED ARTS

The present invention relates to an exposure apparatus for manufacturing semiconductor devices such as IC's or LSI's, image pickup devices such as CCD's or the like, display devices such as liquid crystal panels, magnetic heads or the like.

As for an exposure apparatus used in a lithographic process for semiconductor device manufacturing, there are known a one-two-exposure apparatus (mirror projection aligner) in which a mask pattern is imaged on a wafer by a reflection optical system of a one-to-one magnification and having an arcuate exposure area and a reduction projection exposure apparatus (stepper) in which a mask pattern is imaged on a wafer through a refraction optical system of a reduced magnification, and a plurality of shot areas of the wafer are exposed through a step and repeat system. Recently, the stepper type is dominant because resolution and the alignment accuracy are better.

Recently, a scanning type exposure apparatus has been proposed in SPIE Vol. 1088 Optical/Laser Microlithography II (1989), pages 424–433, in which a mask pattern is imaged on a wafer through a reflection and refraction optical system of reduced magnification, and a plurality of shot areas of the wafer are exposed through a step and scan type exposure method.

Figure 2:
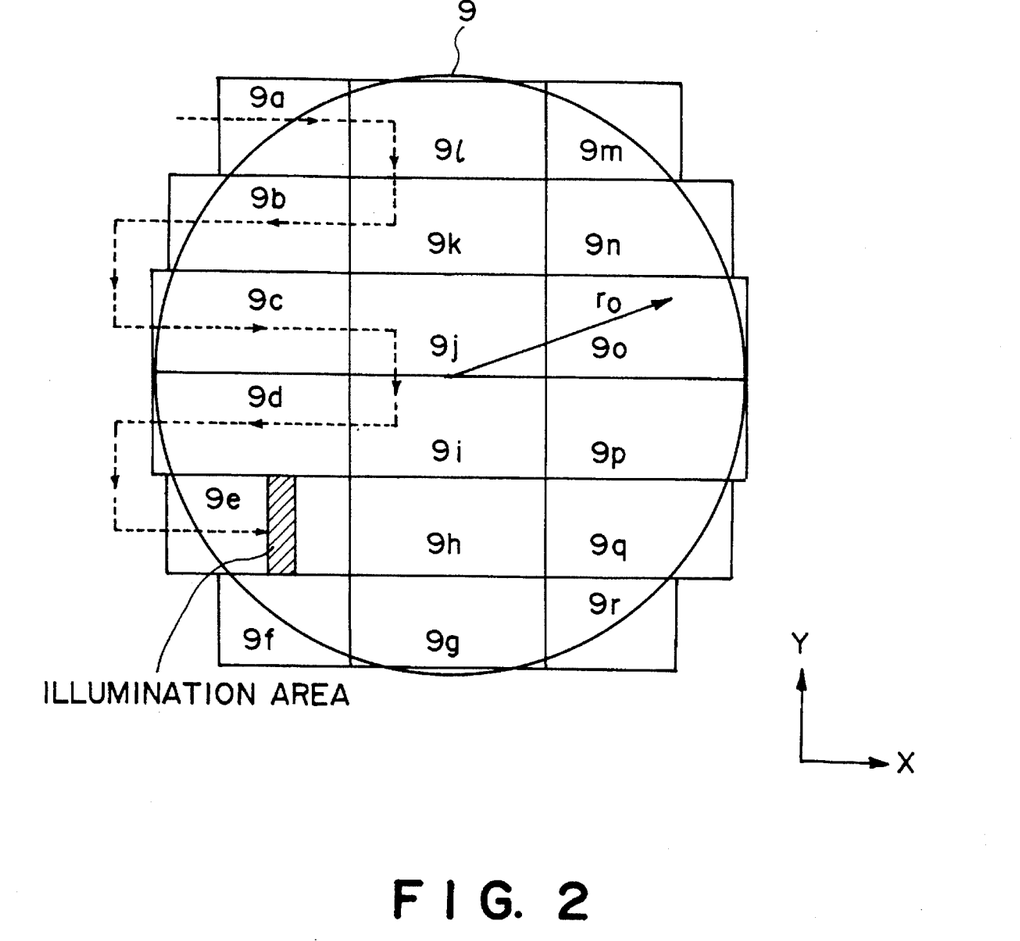
FIG. 2 illustrates a step and scan exposure method.

FIG. 2 illustrates the step and scan type exposure method. As shown in the Figure, the wafer 9 is divided into shot areas 9a, 9b, ... 9r to be exposed by a one X-direction scan. In FIG. 2, the rectangular hatched portion is an illumination area on which a part of the mask is imaged. In the exposure, the wafer 9 is scanned in the X-direction by an illumination area which has a configuration longitudinal in the Y-direction. After the end of the scanning (exposure), the wafer 9 is scanned in a reversed X-direction. Thus, the plurality of shot areas are sequentially scanned along the broken line. An example of an optical system for such an exposure apparatus is disclosed in detail in O plus E, February 1993, pages 96–99.

In the wafer processing in the semiconductor device manufacturing process, oxidation of the surface of the wafer insulative film formation electrode evaporation, ion implantation, exposure, etching or the like are repeated a plurality of times to provide the circuit pattern. When the size of the wafer increases from 6 inches to 8 inches, the thickness of the insulative film and the thickness of the photosensitive material in the exposure step may become non-uniform. If such a wafer is exposed to the pattern, the line width of the pattern varies, and the resolution is deteriorated with the result of lower yield. Particularly in the step and scan exposure method, the one shot exposure area is relatively large, and therefore, the film thickness variation of the photosensitive material in the shot is increased with the result of a significant reduction of resolution.

SUMMARY OF THE INVENTION

Accordingly, it is a principal object of the present invention to provide an exposure apparatus in which the line width variation or improper resolution can be reduced.

According to an aspect of the present invention, there is provided exposure changing means for changing the exposure amount by the exposure beam in accordance with the position in the substrate to be exposed, in an exposure apparatus in which the surface of the substrate to be exposed is scanned with an exposure beam.

In another aspect of the present invention, there is provided film thickness detecting means for detecting a film thickness of the photosensitive material applied on the substrate, and the exposure amount changing means selects the exposure amount for respective positions of the substrate in accordance with a signal indicative of the film thickness of the substrate supplied from the film thickness detecting means.

According to a further aspect of the present invention, the exposure amount changing means is provided with means for changing illuminance on the substrate.

According to a further aspect of the present invention, the exposure amount changing means is provided with means for changing brightness of the light source for supplying the exposure beam.

According to a further aspect of the present invention, there is provided a pulsewise emitting light source for supplying the exposure beam, and the exposure amount changing means is provided with means for changing the time intervals of the pulse emission of the light source.

According to a further aspect of the present invention, the exposure amount changing means is provided with means for changing the scanning speed of a stage for moving the substrate.

According to a further aspect of the present invention, the pattern of the mask is sequentially transferred onto the substrate by scanning the mask and the substrate with the exposure beam. For the transfer, a projection optical system is provided between the mask and the substrate so that the mask pattern is provided onto the substrate.

Using the exposure apparatus of this invention, high precision manufacturing is possible for semiconductor devices such as IC's, LSI's or the like, image pickup devices such as CCD's, display devices such as liquid crystal panels or the like, and magnetic heads or the like.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
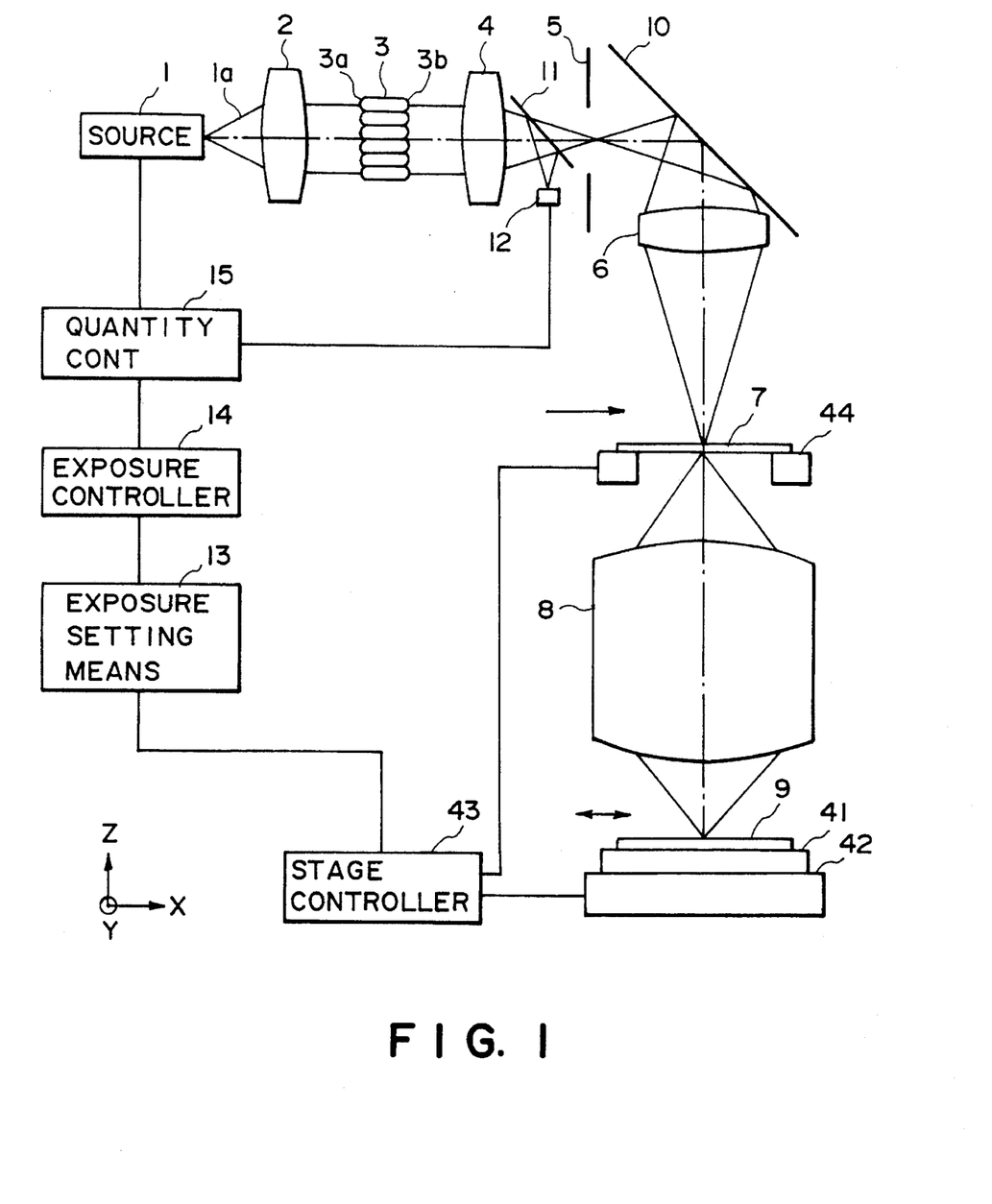
FIG. 1 is a schematic view of a system according to a first embodiment of the present invention.

FIG. 1 schematically shows a system of an apparatus according to a first embodiment. It is in the form of a scanning type projection exposure apparatus for manufacturing various devices.

Illumination light rays la from the light source 1 are condensed in a predetermined range on a light incident plane 3a of a fly eye lens 3. A great number of rays from the emergent side plane 3b of the fly eye lens (emergent from a great number of lenslets), are overlaid on the masking blade 5 by a condenser lens 4. The rays having passed through the masking blade 5 are folded by 90 degrees downwardly by a folding mirror 10 to be incident on an imaging lens 6. The rays are condensed on the reticle 7 by the imaging lens 6. At this time, the lens 6 forms an image of the masking blade 5 on the reticle 7. Since the masking blade 5 and the reticle 7 are optically conjugate with each other, the dimensions and configurations of the illumination area on the reticle 7 are determined by adjusting the dimensions and configuration of the opening of the masking blade 5. A device pattern on the reticle 7 is projected onto the wafer 9 through the projection optical system 8, and an image of the device pattern is formed on the wafer 9. The projection optical system 8 may be constituted by a refraction system only, or by a combination of a refraction system and a reflection system.

The reticle 7 is held on a reticle stage 44 movable in the X-direction (shown by the arrow in FIG. 1). On the reticle 7, a rectangular illumination area is formed by the above-described illumination optical system, the illumination area having a width smaller than that of a pattern area in the X-direction of a reticle stage 44 scan and having a length larger than that of the pattern area in the Y-direction perpendicular to the scanning direction. When the reticle stage 44 is moved in the X-direction by an unshown driving mechanism, the device pattern on the reticle is sequentially illuminated by illumination light of rectangular shape constituting the rectangular illumination area. The scanning speed and the position of the reticle stage 44 are precisely controlled by stage control means 43. The device pattern of the reticle 7 is imaged on the wafer 9 at a predetermined reduced magnification through the projection optical system 8. The wafer 9 is held on a wafer holder 41 provided with a position control mechanism for the optical axis direction and with an inclination control mechanism for the purpose of aligning the surface of the wafer 9 to be exposed with the imaging plane of the projection optical system. The wafer holder 41 is mounted on a wafer stage 42. During the exposure, the wafer stage 42 is moved in the X-direction at a speed of the reticle stage scanning speed multiplied by the magnification of the projection optical system 8, in synchronism with the movement of the reticle stage 44. As shown in FIG. 2, the wafer stage 42 makes a stepping motion in the X- and Y-directions to feed to the exposure position the next shot adjacent in the X- and Y-directions. The scanning speed and the position of the wafer stage 42 are precisely controlled by the stage control means 43 together with the reticle stage 44. By repeating the stepping motion and the scanning exposure, the device pattern image of the reticle 7 is transferred to the entire exposure area of the wafer 9.

A half mirror 11 is disposed in the optical path of the illumination system to reflect a part of the illumination light rays la. A photodetector 12 receives the light reflected by the half mirror 11 and produces an electric signal indicative of the quantity of the light In the scanning exposure it is required to provide constant illuminance on the wafer 9 and the constant scanning speed of the wafer stage 42 in order to provide a constant exposure amount. Therefore, the brightness of the light source 1 is controlled to be constant in accordance with the output of the photodetector 12, by the exposure amount adjusting means 15. In addition, the reticle stage 44 and the wafer stage 42 are moved at a constant speed by the stage control means 43.

If the film thicknesses of the insulation film on the wafer 9 or the photosensitive material applied thereon or the like varies depending on the positions on the wafer 9, the optimum exposure amount is different depending on the position on the wafer 9. The exposure amount setting means 13 has a function of setting the exposure amount in accordance with the position on the wafer 9 and a function of setting the exposure amount for each shot from the set exposure amount distribution for each shot as a function of the scanning position. For example, the exposure amount that is set has a function of a radius R from the center of the wafer 9 in FIG. 2. On the basis thereof, the exposure amount setting means 13 sets the exposure amount for the respective shots (9a–9r) as a function of X in an average in Y-direction.

The exposure amount setting means 13 may set the exposure amount for each shot as a function of a scanning position, in place of setting the exposure amount as a function of a position on the wafer 9. Further, alternatively, the wafer 9 may be divided into a plurality of blocks different from the division of the shot areas, and the exposure amount can be set for each of the blocks.

Figure 3:
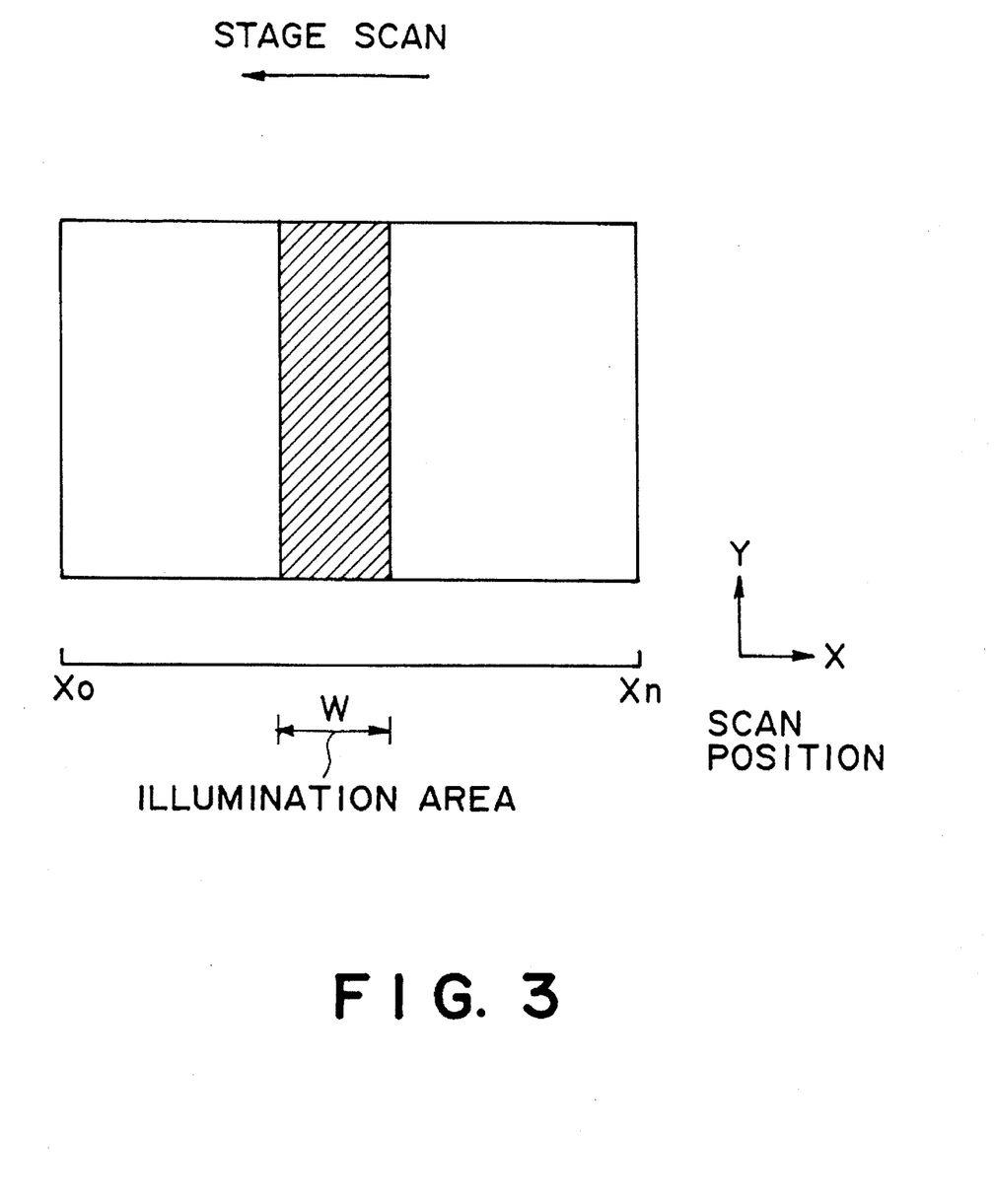
FIG. 3 illustrates an illumination area and the shot on the wafer.
Figure 4:
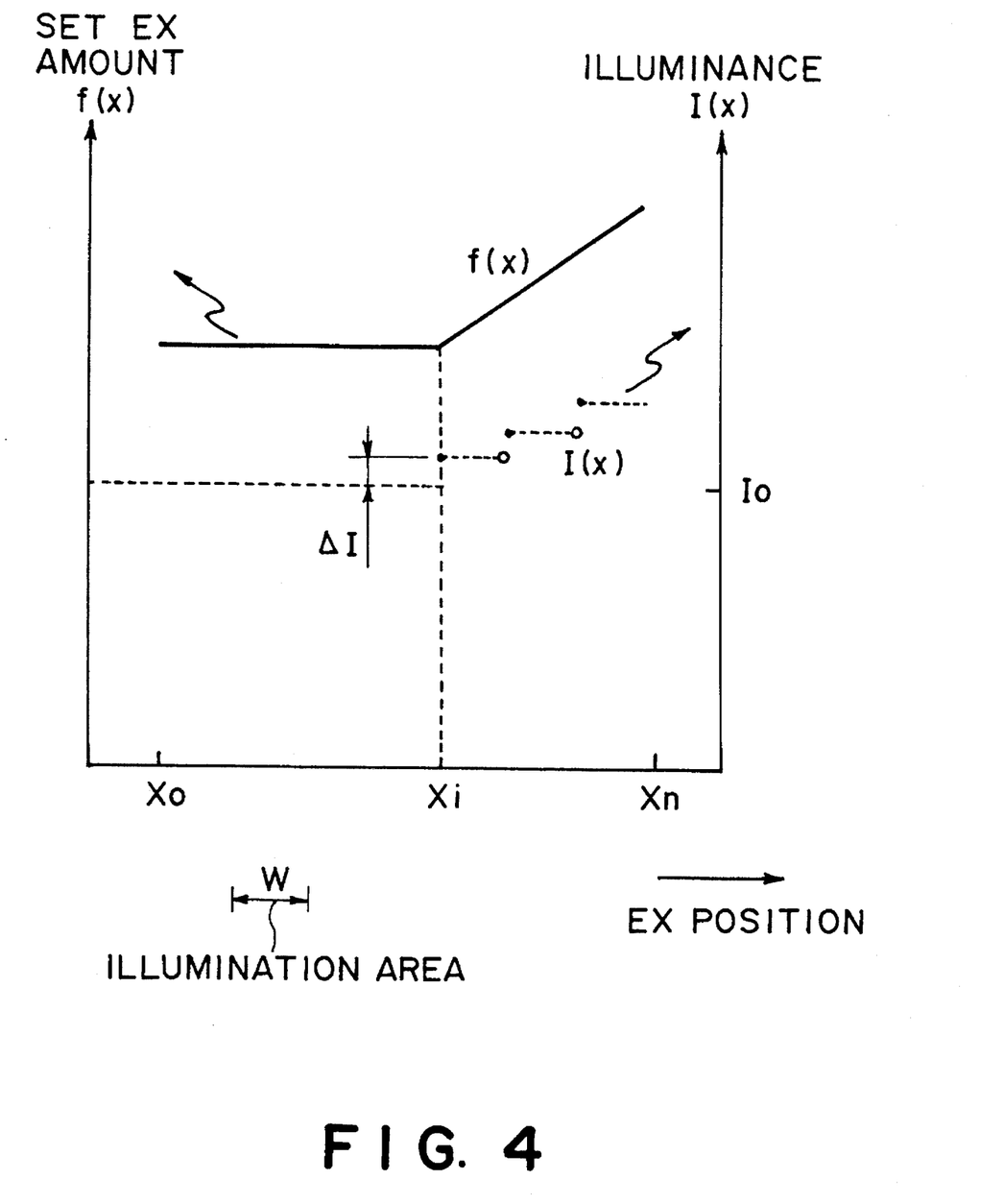
FIG. 4 illustrates a relationship between a set exposure amount and a controlled illuminance in the first embodiment.

FIG. 3 shows a shot area and an illumination area for the shot area. The shot area is exposed in the area $x_0$–$x_n$ in the X-direction by scanningly moving the stage in the direction of the arrow, in the direction from $x_0$ to $x_n$. In the Figure, the hatched portion is the illumination area with the width W in the X-direction. The exposure amount is set such that in FIG. 2, it is constant inside the radius $r_0$, and increases outside the radius $r_0$ in proportion to the radius r. In this case, the set exposure amount for a certain shot is calculated by the exposure amount setting means 13, and is set as shown in the graph of FIG. 4. As will be understood from this graph, the set exposure amount f(x) is constant within the range of $x_0$–$x_i$ and is proportional to x in the range $x_i$–$x_n$.

In the apparatus of FIG. 1, the exposure amount control means 14 changes the exposure amount by adjusting the brightness of the light source 1 by the light quantity adjusting means 15 so that the set exposure amount f(x) calculated by the exposure amount setting means 13 is satisfied. The exposure amount control means 14 calculates the illuminance I(x) for each shot as a function of the scanning position X in accordance with the instructions from the exposure amount setting means 13, and supplies instructions to the exposure amount adjusting means 15 so as to provide the predetermined illuminance I(x). The light quantity adjusting means 15 controls the electric power to be supplied to the light source 1 in accordance with the instruction signal from the exposure amount control means 14 and the output signal from the photodetector 12 so that the brightness of the light source 1 is such as to provide the predetermined illuminance. For the interrelation between the electric power supplied to the light source 1 and the illuminance, data is taken beforehand so as to determine the interrelation therebetween. Usually, the brightness of the light source and the illuminance of the surface illuminated are proportional.

In FIG. 4, the illuminance I(x) calculated by the exposure amount control means 14 is indicated by a broken line. This corresponds to the set exposure amount f(x) shown in the Figure. The illuminance I(x) is expressed as a function of a position relative to the left end of the illumination area, under the condition that the illuminance distribution in the illumination area on the wafer 9 is uniform and constant. Until the left end of the illumination area comes to the position $x_i$, the illuminance 10 is maintained; at the position $x_i$, the illuminance is increased to $i_0+\delta I$; after scanning is effected through W, the illuminance is increased to $I_0 +2\delta I$; and the position $x=x_i+2W$ is reached the illuminance is further increased to $I_0+3\delta I$. During this, the stage control means 43 controls the reticle stage 44 and the wafer stage 42 so that the scanning speeds are maintained constant. By changing the illuminance in the manner described above, the scanning exposure can be carried out with the exposure amount corresponding to the function f(x) of the set exposure amount.

This is expressed by a general equation as follows:

$$f(x) = (1/V)* \int_{X-W}^{X} I(\xi)d\xi$$

where W (mm) is a width of the illumination area on the wafer measured in the scanning direction, V (mm/sec) is a scanning speed of the wafer stage, f(x) is the exposure amount, and III(x) is the illuminance. This equation is provided by converting the variation in the integration function from x to $\xi$.

In this embodiment, the exposure amount on the wafer 9 is controlled by adjusting the brightness of the light source. When the light source is in the form of a laser producing pulsewise light, the exposure amount control is possible also by changing the intervals of the pulse emission by exposure amount control means 14. This will be understood from I(x)=J×S (x) where J (mJ/cm$^2$) is the energy per pulse, S(x) (sec$^1$) is the frequency of repetition as a function of the scanning position X.

Figure 5:
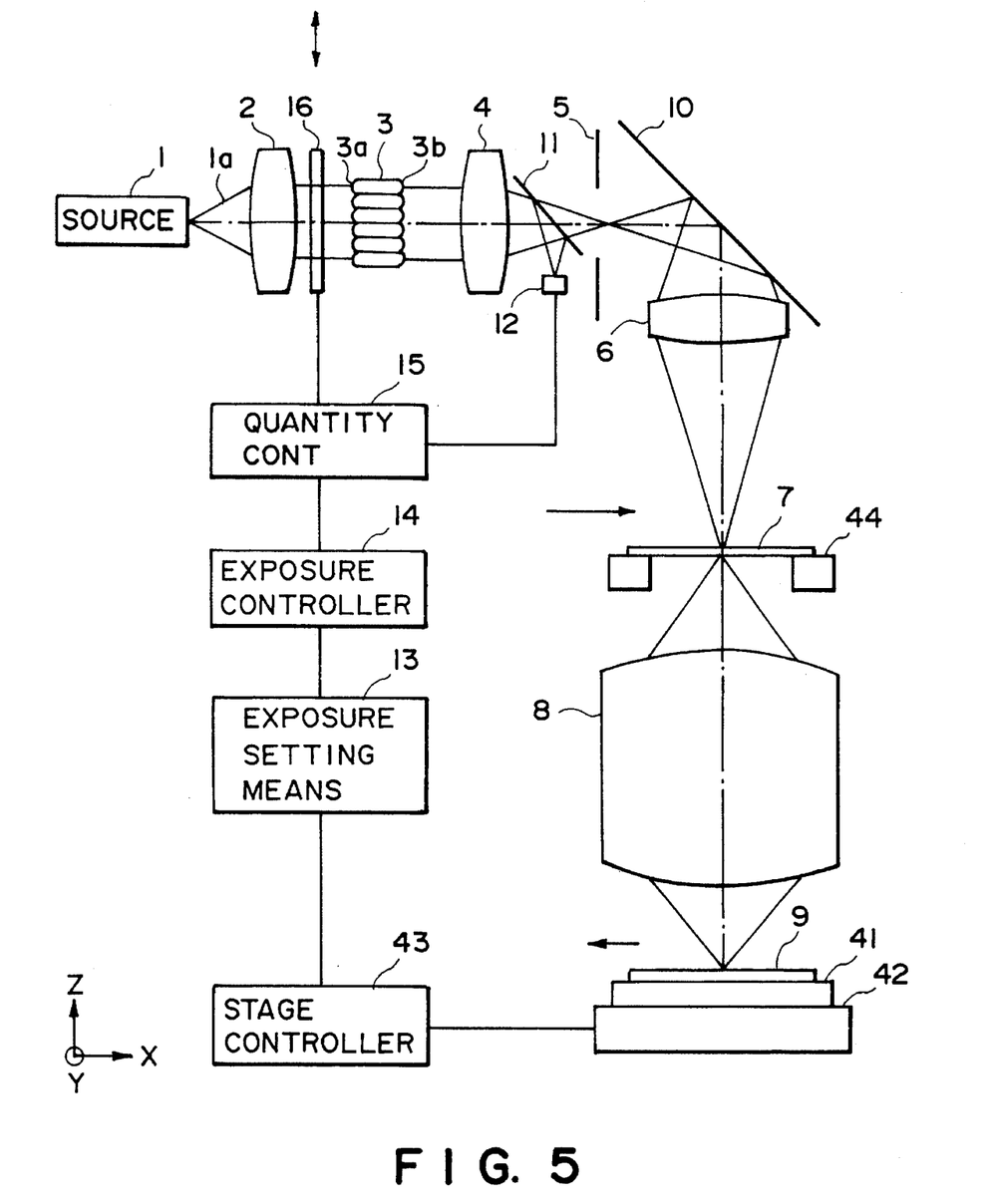
FIG. 5 illustrates an apparatus according to a second embodiment.

FIG. 5 illustrates a second embodiment, in which the structure of the scanning projection exposure apparatus is substantially the same as that of the first embodiment. However, in this embodiment, in order to change the exposure amount in the shot, the light transmittance of the filter 16 disposed between the positive lens 2 of the illumination system and the fly eye lens 3 is controlled by the light quantity adjusting means 15. As for a method of controlling the light transmittance, the transmittance distribution is given in the direction of the arrow in FIG. 5, and the position of the filter 16 is changed in the direction indicated by the arrow by the light adjusting means 15. The light quantity adjusting means 15 drives the filter 16 in accordance with the output of the photodetector 12 and the output of the exposure amount control means, so that the predetermined illuminance is provided.

Figure 6:
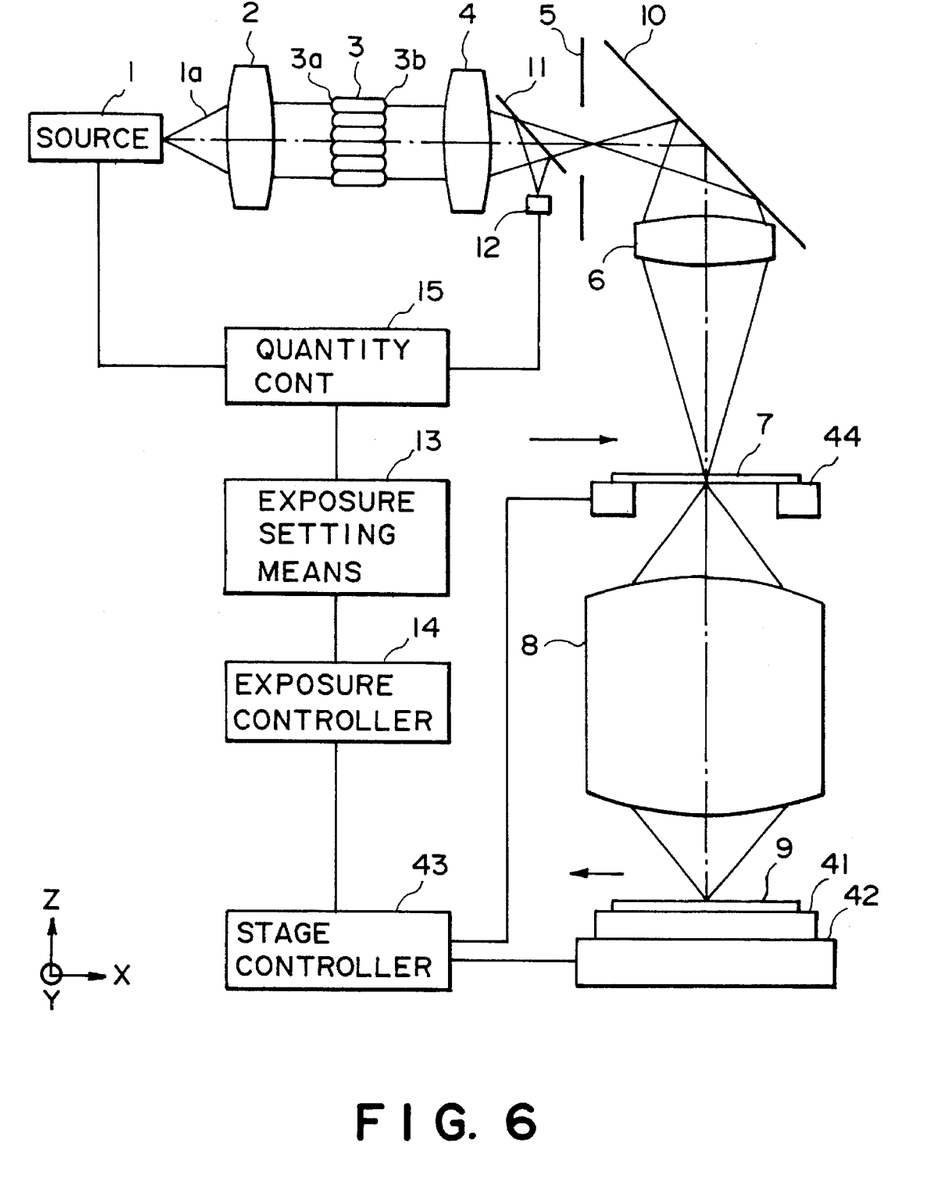
FIG. 6 illustrates an apparatus according to a third embodiment.

FIG. 6 illustrates a third embodiment of the present invention, in which the structure of the scanning projection exposure apparatus is substantially the same as that of the first embodiment (FIG. 1). However, in this embodiment, in order to change the exposure amount in the shot, the preferable scanning speeds of the reticle stage 44 and the wafer stage 42 are calculated by the exposure amount control means 14. On the basis of the output thereof, the stage control means 43 controls the moving speeds of the reticle stage 44 and the wafer stage 42. At this time, the illuminance on the wafer 9 is maintained constant by the light quantity adjusting means 15.

Figure 7:
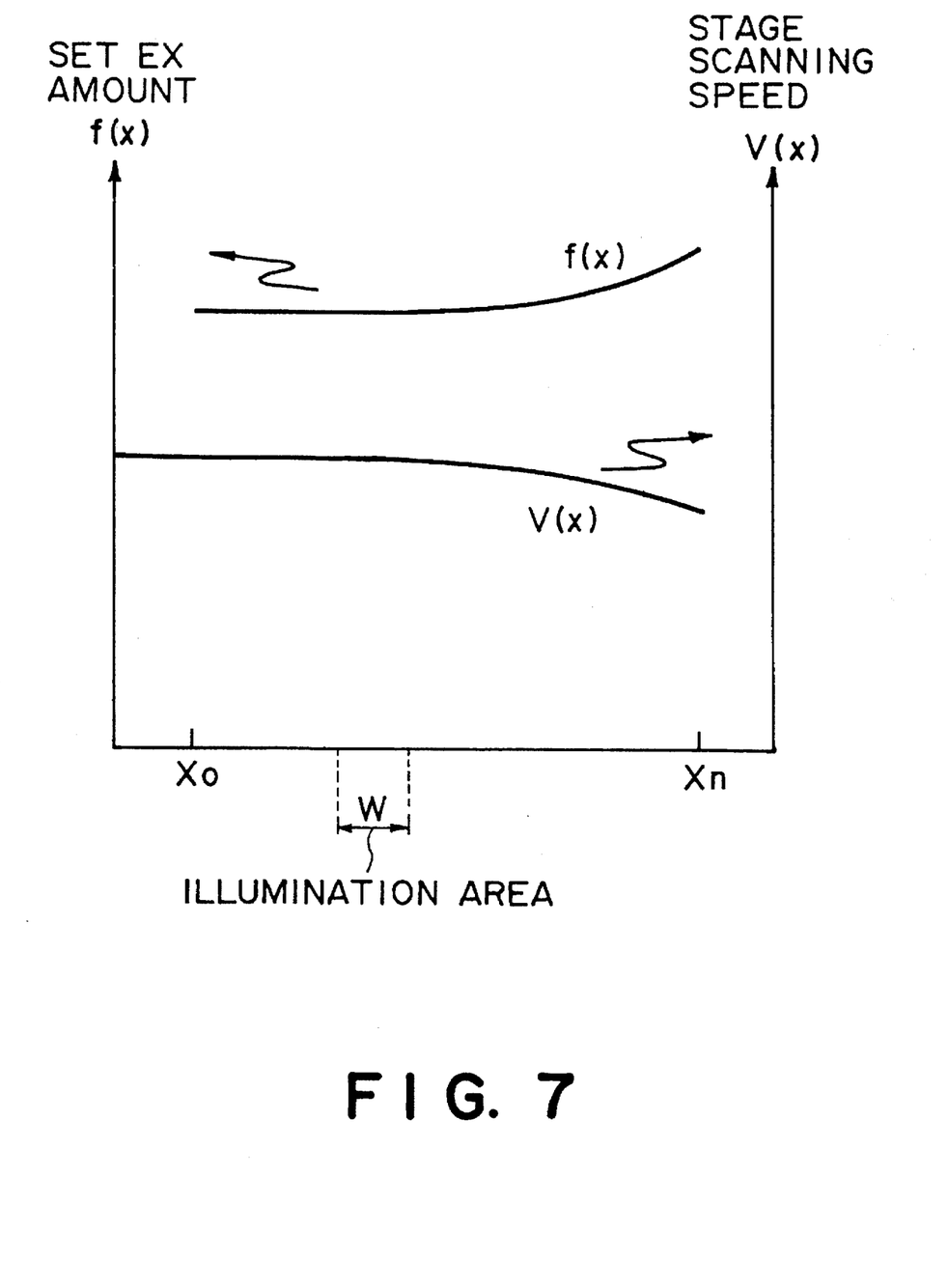
FIG. 7 illustrates a relation between a set exposure amount and a controlled scanning speed in the third embodiment.

FIG. 7 is a graph of the set exposure amount f(x) in the shot expressed as a function of a position x at the left end of the illumination area, calculated by the exposure amount setting means 13 in accordance with the third embodiment shown in FIG. 6, and a scanning speed V(x) of the wafer stage 42 calculated by the exposure amount control means 14. Here, f(x) and V(x) are given so as to satisfy the following:

$$f(x) = I_0* \int_{X-W}^{X} \{1/V(\xi)\}d\xi$$

where $I_0$ is uniform and constant illuminance on the wafer surface, and W is a width of the illumination area measured in the scanning direction This equation is provided by converting the variation in the integration function from x to $\xi$.

The wafer stage 42 is controlled by the stage control means 43, and is moved at a speed V(x). The reticle stage 44 is moved in synchronism with the wafer stage 42 at a speed provided by multiplying the scanning speed V(x) of the wafer stage 42 multiplied by a reciprocal of the reduction magnification of the projection optical system 8.

Figure 8:
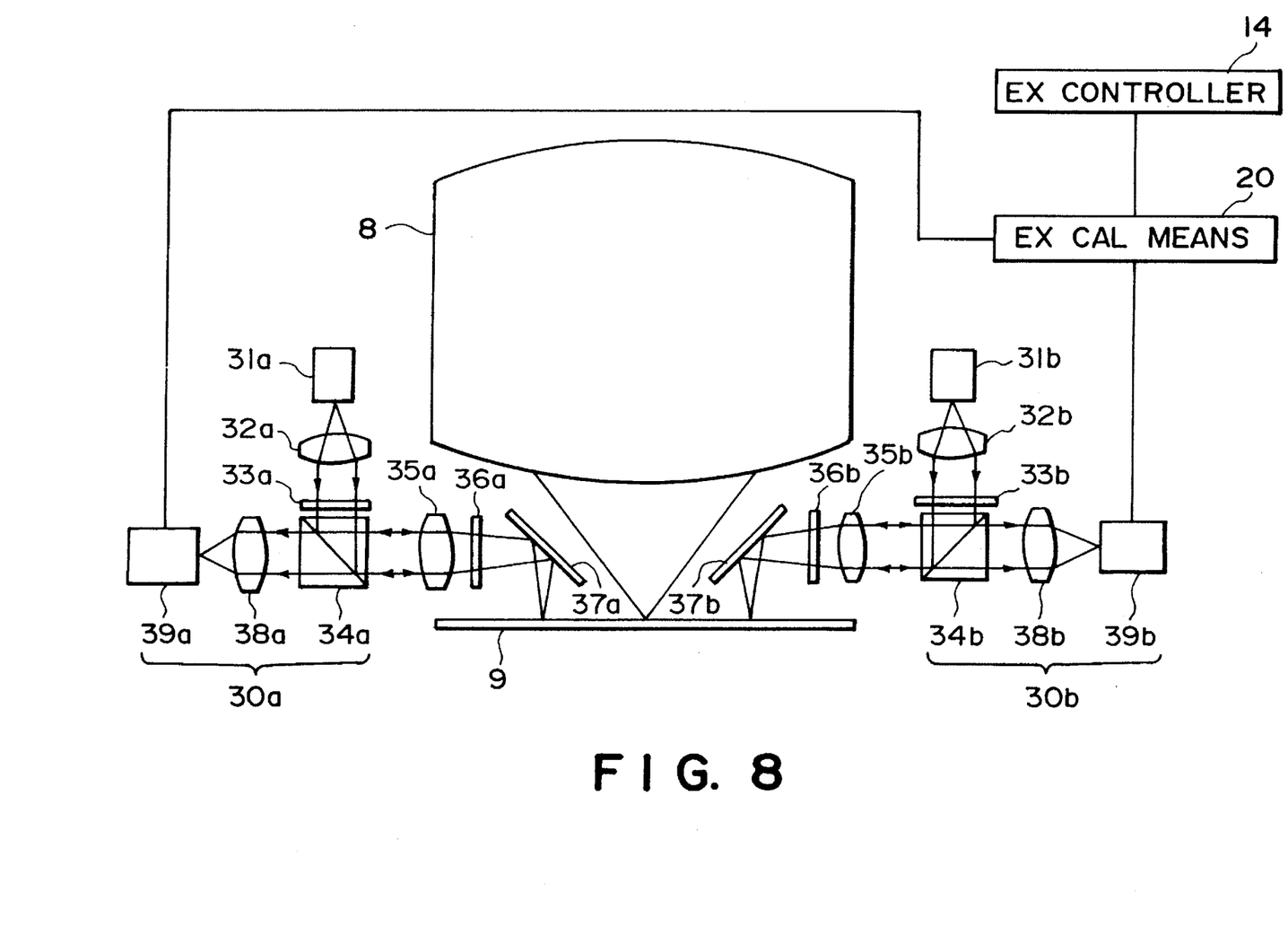
FIG. 8 illustrates an apparatus according to a fourth embodiment.

FIG. 8 schematically shows an apparatus of a fourth embodiment according to the present invention. The structure of the upper part of the projection optical system 8 and the wafer stage or the like are the same as those described hereinbefore, and therefore, they are omitted from the Figure. In the above-described first, second and third embodiments, the exposure amount is set in accordance with the proper exposure amount distribution determined beforehand. In this embodiment, there are provided film thickness measuring means 30a and 30b for calculating film thickness on the basis of measured reflectance of the wafer, and exposure amount calculating means 20 for calculating a proper exposure amount at the respective positions, on the basis of the measured film thickness.

FIG. 8 shows specifics of the reflectance measuring means 30a and 30b for the wafer 9. The light rays from the measurement light sources 31a and 31b are collimated by lenses 32a and 32b and are incident on the polarizing plates 33a and 33b, which transmit only the light of S-polarization perpendicular to the sheet of the drawing. The light beam is reflected by polarization beam splitters 34a and 34b, and is condensed by lenses 35a and 35b. Further, the light is converted to a circularly polarized light from the S-polarized light by ¼ wave plates 36a and 36b. The light is then folded downwardly by folding mirrors 37a and 37b to be incident on a measuring point on the wafer 9. The light rays reflected by the wafer 9 are folded by 90 degrees by the folding mirrors 37a and 37b. The light is converted from the circularly polarized light to p-polarized light by the ¼ wave plates 36a and 36b. The light is collimated by the lenses 35a and 35b, and is transmitted through the polarization beam splitters 34a and 34b. The light is condensed on photoelectric transducer elements 39a and 39b by lenses 38a and 38b.

The film thickness measuring means 30a and 30b are disposed at the respective sides in the scanning direction of the wafer stage 42 so as to sandwich the illumination area. As will be understood, they have the same structure. In this embodiment, the film thickness measuring means comprises a pair of the same means. Alternatively, however, a plurality of measuring systems may be provided in a direction perpendicular to the scanning direction.

The exposure amount calculating means 20 calculates the optimum exposure amount at each position on the wafer 9 in accordance with the results of measurements of the film thickness of the wafer 9 from the photoelectric transducer elements 39a and 39b. Here, the interrelation between the reflectance and the film thickness of the wafer 9 and the interrelation between the film thickness and the optimum exposure amount, have been determined beforehand. The exposure amount control means 14 controls the illuminance or the stage movement speed in accordance with the optimum exposure amount calculated by the exposure amount calculating means 20.

In the foregoing first and third embodiments, the illuminance distribution of the illumination area of the wafer is uniform, but even if the illuminance non-uniformity exists in the scanning direction, the present invention is usable. For example, $D(\xi)$ is a function indicative of the shape of the illuminance distribution in the scanning direction, $\xi$ is a coordinate in the scanning direction in the illumination area (in the slit), and the point of origin is the left end of the illumination area. The actual illuminance distribution is defined as $I \times D(\xi)$ which is the intensity I multiplied by the shape of the configuration $D(\xi)$. Here, I is a function $I(x)$ of a position on the wafer at the left end of the illumination area. The scanning speed of the wafer stage is V, and the width of the illumination area measured in the scanning direction is W. The illuminance $I(x)$ for the set exposure amount $f(x)$ satisfies the following:

$$f(x) = (1/V)* \int_{X-W}^{X} I(\xi) \times D(\xi - x - W) d\xi$$

where $\xi$ is the variation of the integration function.

The description will be made as to the device manufacturing method using the above-described scanning exposure apparatuses.

Figure 9:
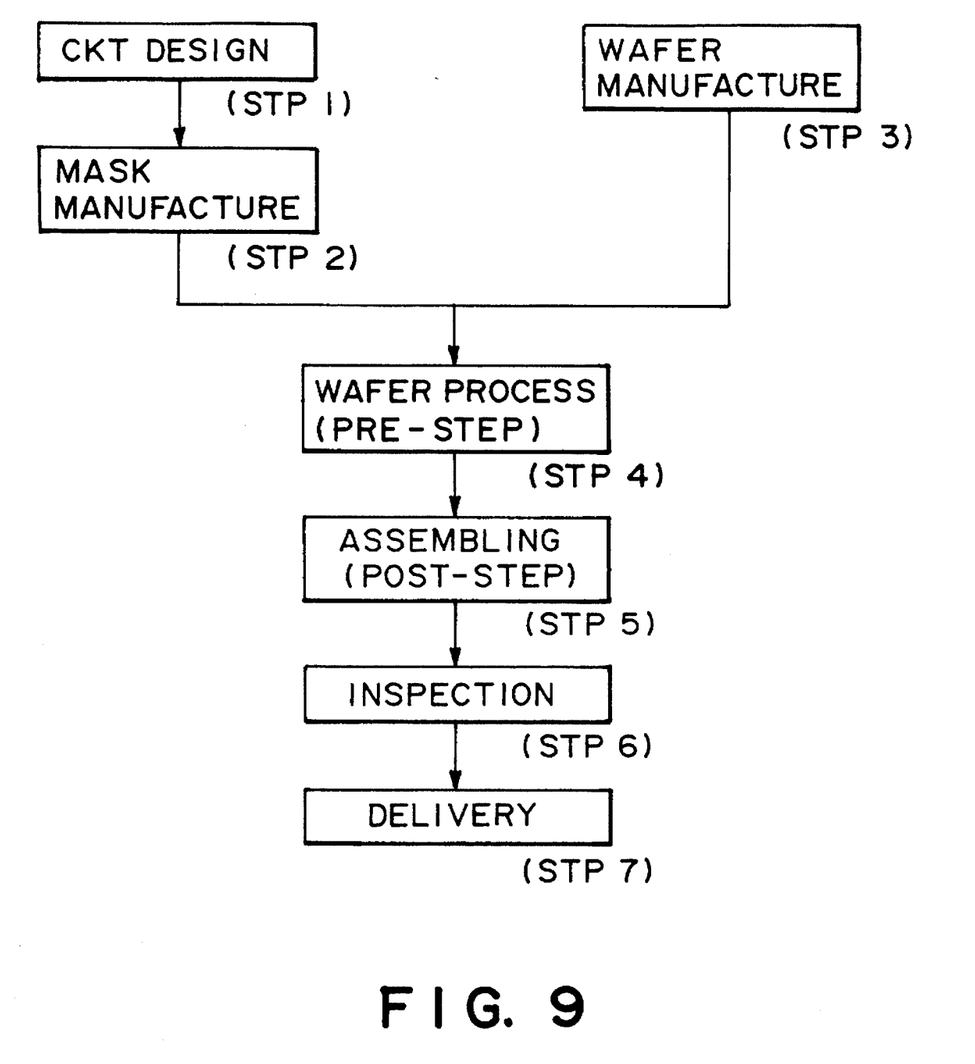
FIG. 9 is a flow chart of semiconductor device manufacturing steps.

FIG. 9 is a flow chart of manufacturing semiconductor devices such as IC's, LSI's or the like, or devices such as liquid crystal panels or CCD's or the like. At step 1, (circuit design), the circuits of the semiconductor device are designed. At step 2, a mask having the designed circuit pattern is manufactured. On the other hand, at step 3, a wafer is manufactured using the proper material such as silicon. Step 4 is called a pre-step, in which an actual circuit pattern is formed on a wafer through lithographic techniques using the prepared mask and wafer. At step 5 (post-step), a semiconductor chip is manufactured from the wafer subjected to the operations of step 4. The step 5 includes assembling steps (dicing, bonding), packaging step (chip sealing) or the like. At step 6, the operation of the semiconductor device manufactured by the step 5 is inspected, and a durability test thereof is carried out. In this manner, the semiconductor device is manufactured and delivered at step 7.

Figure 10:
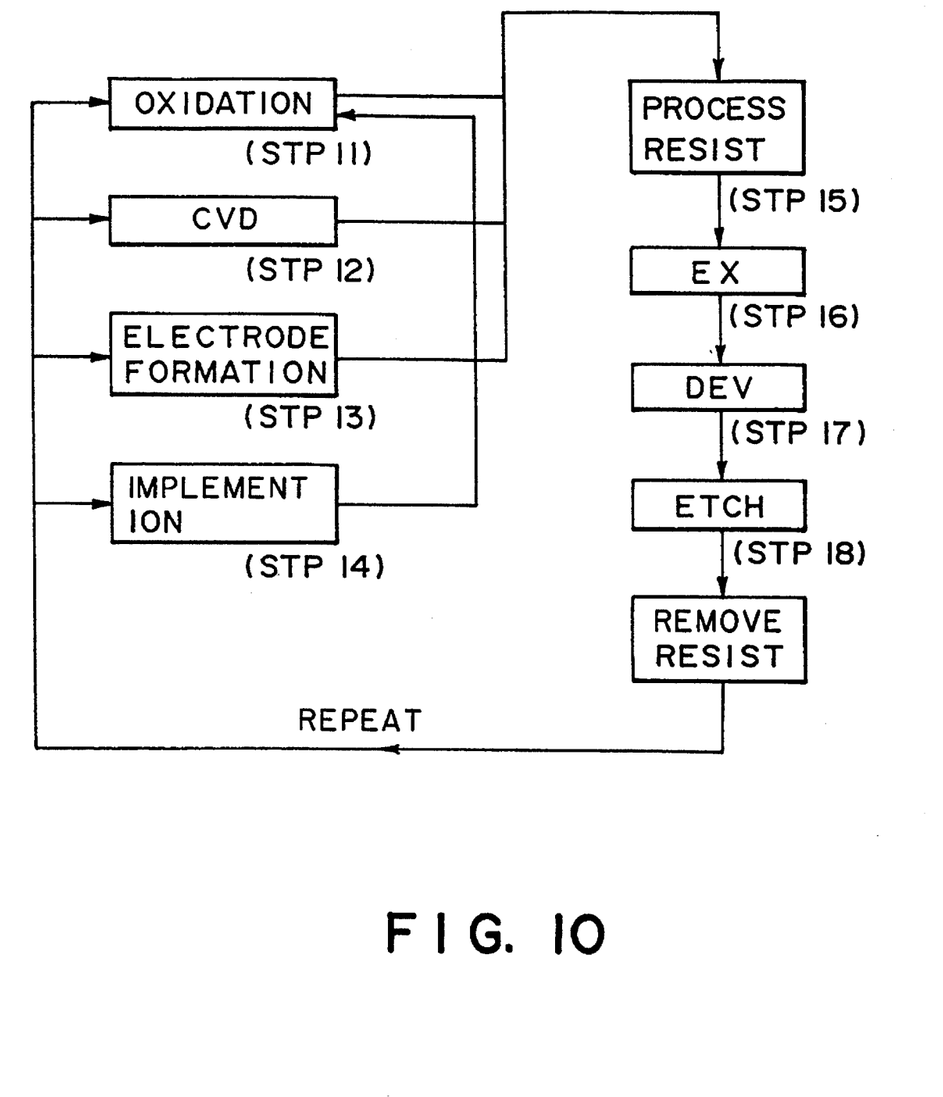
FIG. 10 is a flow chart of wafer processing in FIG. 9.

FIG. 10 is a flow chart of detailed wafer processing. At step 11, the surface of the wafer is oxidized. At step 12 (CVD), an insulating film is formed on a surface of the wafer. At step 13 (electrode formation), an electrode is formed on the wafer by evaporation. At step 14 (ion injection), the ion is implemented into the wafer. At step 15 (resist processing), a photosensitive material is applied on the wafer. At step 16 (exposure), the circuit pattern of the mask is projected onto the wafer by the above-described exposure apparatus. At step 17 (development), the exposed wafer is developed. At step 18 (etching), the portions outside the resist image are removed. At step 19 (resist removal), the resist is removed after the etching. By repeating the above-described steps, overlaid circuit patterns are formed on the wafer.

According to the manufacturing method of the invention, a highly integrated circuit pattern can be formed in the semiconductor devices or the like.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:

means for directing an exposure beam to a substrate to be exposed, through a a mask;

means for scanning the mask and the substrate with the exposure beam, said scanning means comprising a mask stage for holding the mask and a scanning stage for carrying the substrate, said mask stage moving in synchronism with movement of said scanning stage; and exposure amount changing means for changing an amount of exposure by the exposure beam in accordance with a position on the substrate.

2. An apparatus according to claim 1, wherein said exposure amount changing means comprises means for changing an intensity of the exposure beam.

3. An apparatus according to claim 2, wherein said exposure amount changing means comprises means for changing a brightness of a light source for supplying the exposure beam.

4. An apparatus according to claim 2, wherein said exposure amount changing means changes the amount of exposure by the exposure beam during the scanning.

5. An apparatus according to claim 1, wherein said scanning means comprises a scanning stage for carrying the substrate.

6. An apparatus according to claim 1, further comprising an optical system for imaging a pattern of the mask on the substrate with the exposure beam, between said mask stage and said scanning stage.

7. An apparatus according to claim 6, wherein said exposure amount changing means changes the amount of exposure by the exposure beam during the scanning.

8. An exposure apparatus comprising:

means for scanning a substrate to be exposed with an exposure beam, said scanning means comprising a light source for supplying pulsewise light; and exposure amount changing means for changing an amount of exposure by the exposure beams in accordance with a position on the substrate.

9. An apparatus according to claims 8, wherein said exposure amount changing means comprises means for changing a period of the pulsewise light.

10. An exposure apparatus comprising:

scanning means for scanning a substrate to be exposed with an exposure beam, said scanning means comprising a scanning stage for carrying the substrate; and exposure amount changing means for changing an amount of exposure by the exposure beam in accordance with a position on the substrate, said exposure amount changing means comprising means for changing a speed of said scanning stage.

11. An apparatus according to claim 10, wherein said exposure amount changing means changes the amount of exposure by the exposure beam during the scanning.

12. An exposure apparatus comprising:.

scanning means for scanning a substrate to be exposed with an exposure beam; and exposure amount changing means for changing an amount of exposure by the exposure beam in accordance with a position on the substrate, said exposure amount changing means changing the exposure amount in accordance with a film thickness distribution of a radiation sensitive layer on the substrate.

13. An exposure apparatus comprising:

means for scanning a substrate to be exposed with an exposure beam;

means for detecting a distribution of a film thickness of a radiation sensitive layer on the substrate; and exposure amount changing means for changing an amount of exposure by the exposure beam in accordance with the film thickness distribution.

14. An apparatus according to claim 13, wherein said exposure amount changing means comprises means for changing an intensity of the exposure beam.

15. An apparatus according to claim 14, wherein said exposure amount changing means comprises means for changing a brightness of a light source for supplying the exposure beam.

16. An apparatus according to claim 13, wherein said scanning means comprises a light source for supplying pulsewise light.

17. An apparatus according to claim 16, wherein said exposure amount changing means comprises means for changing a period of the pulsewise light.

18. An apparatus according to claim 13, wherein said scanning means comprises a scanning stage for carrying the substrate.

19. An apparatus according to claim 18, wherein said exposure amount changing means comprises means for changing a speed of said scanning stage.

20. An apparatus according to claim 13, wherein said scanning means comprises a mask stage for holding a mask and moving in synchronism with movement of said scanning stage, and means for directing the exposure beam to the substrate through the mask.

21. An apparatus according to claim 20, further comprising an optical system for imaging a pattern of the mask on the substrate with the exposure beam, between said mask stage and said scanning stage.

22. An apparatus according to claim 13, wherein said exposure amount changing means changes the amount of exposure by the exposure beam during the scanning.

23. An exposure apparatus comprising:

means for directing an exposure beam to an object to be exposed through a mask and for scanning the mask and the object with the exposure beam; and means for changing an amount of exposure by the exposure beam in accordance with a position on the object.

24. An apparatus according to claim 23, wherein said exposure amount changing means changes the amount of exposure by the exposure beam during the scanning.

25. An exposure apparatus comprising:

means for scanning an object to be exposed with an exposure beam; and means for changing an amount of exposure by the exposure beam, by changing a speed of the scanning, in accordance with a position on the object.

26. An apparatus according to claim 25, wherein said exposure amount changing means changes the amount of exposure by the exposure beam during the scanning.

27. An exposure apparatus comprising:

means for scanning an object to be exposed with an exposure beam; and means for changing an amount of exposure by the exposure beam in accordance with a film thickness distribution of a radiation sensitive layer on the object.

28. An apparatus according to claim 27, further comprising means for detecting the film thickness distribution of the radiation sensitive layer.

29. An apparatus according to claim 27, wherein said exposure amount changing means changes the amount of exposure by the exposure beam during the scanning.

30. An exposure apparatus comprising:

means for scanning an object to be exposed with pulsewise light from a light source; and means for changing an amount of the exposure by the pulsewise light in accordance with a position on the object.

31. An apparatus according to claim 30, wherein said exposure amount changing means changes the amount of exposure by the exposure beam during the scanning.

32. A device manufacturing method including printing a device pattern on a workpiece by scanning the workpiece with an exposure beam, said method comprising:

directing an exposure beam to an object to be exposed through a mask and for scanning the mask and the object with the exposure beam; and changing an amount of exposure by the exposure beam in accordance with a position on the object.

33. A device manufacturing method including printing a device pattern on a workpiece by scanning the workpiece with an exposure beam, said method comprising:

scanning an object to be exposed with an exposure beam; and changing an amount of exposure by the exposure beam, by changing a speed of the scanning, in accordance with a position on the object.

34. A device manufacturing method including printing a device pattern on a workpiece by scanning the workpiece with an exposure beam, said method comprising:

scanning an object to be exposed with an exposure beam; and changing an amount of exposure by the exposure beam in accordance with a film thickness distribution of a radiation sensitive layer on the object.

35. A device manufacturing method including printing a device pattern on a workpiece by scanning the workpiece with an exposure beam, said method comprising:

scanning an object to be exposed with pulsewise light from a light source; and changing an amount of the exposure by the pulsewise light in accordance with a position on the object.

36. A device manufacturing method including printing a device pattern on a workpiece by scanning the workpiece with an exposure beam, said method comprising:

detecting a distribution of a film thickness of a radiation sensitive layer on the workpiece; and changing an amount of exposure by the exposure beam in accordance with the film thickness distribution detected in said detecting step.

37. A method according to claim 36, further comprising directing the exposure beam to the workpiece through a mask and moving the mask and the workpiece relative to the exposure beam.

38. A method according to claim 21, wherein said scanning step comprises imaging on the workpiece the device pattern of the mask with the exposure beam through an imaging optical system between the mask and the workpiece.

39. A method according to claim 36, further comprising executing said changing step during the scanning.

40. A chip manufactured through a method as defined in claim 36.

* * * * *

UNITED STATES PATENT AND TRADEMARK OFFICE
CERTIFICATE OF CORRECTION

PATENT NO. : 5,526,093    Page 1 of 4
DATED : June 11, 1996
INVENTOR(S) : Kazuhiro TAKAHASHI It is certified that error appears in the above-indentified patent and that said Letters Patent is hereby corrected as shown below:

ON THE COVER PAGE:

In item [56] "References Cited":

Under "U.S. PATENT DOCUMENTS" the following should be inserted:

```
--4,440,493   4/1984    Hiraga
  4,947,030   8/1990    Takahashi
  4,947,047   8/1990    Muraki
  4,503,335   3/1985    Takahashi
  4,822,975   4/1989    Torigoe
  4,825,247   4/1989    Kemi, et al.
  4,851,882   7/1989    Takahashi, et al.
  4,874,954  10/1989    Takahashi, et al.
  5,153,419  10/1992    Takahashi
  5,250,797  10/1993    Sano, et al.
```

FOREIGN PATENT DOCUMENTS

```
4-70754   3/1992   Japan--.
```

Under "OTHER PUBLICATIONS":

"SPIE;" should read --SPIE,--.

UNITED STATES PATENT AND TRADEMARK OFFICE
CERTIFICATE OF CORRECTION

PATENT NO. : 5,526,093
DATED : June 11, 1996
INVENTOR(S) : Kazuhiro TAKAHASHI

It is certified that error appears in the above-indentified patent and that said Letters Patent is hereby corrected as shown below:

IN THE DISCLOSURE:

COLUMN 1:

Line 18, "area" should read --area,--;
Line 35, "9a, 9b,... 9r" should read --9a, 9b,..., 9r--;
Line 47, "wafer" should read --wafer,--; and
Line 48, "formation" should read --formation,--.

COLUMN 3:

Line 13, "1a" should read --1a--.

COLUMN 4:

Line 3, "1a" should read --1a--;
Line 5, "light" should read --light.--, and "exposure" should read --exposure,--; and
Line 26, "in" (second occurrence) should read --in the--.

UNITED STATES PATENT AND TRADEMARK OFFICE
CERTIFICATE OF CORRECTION

PATENT NO. : 5,526,093  Page 3 of 4
DATED : June 11, 1996
INVENTOR(S) : Kazuhiro TAKAHASHI It is certified that error appears in the above-indentified patent and that said Letters Patent is hereby corrected as shown below:

COLUMN 5:

Line 11, "10" should read --$I_0$--;
Line 14, "and" should read --and when--; and
Line 41, "($sec^1$)" should read --($sec^{-1}$)--.

COLUMN 6:

Line 55, "p-polarized" should read --P-polarized--.

COLUMN 8:

Line 14, "a" (second occurrence) should be deleted;
Line 49, "beams" should read --beam--; and
Line 51, "claims 8," should read --claim 8,--.

UNITED STATES PATENT AND TRADEMARK OFFICE
CERTIFICATE OF CORRECTION

PATENT NO. : 5,526,093
DATED : June 11, 1996
INVENTOR(S) : Kazuhiro TAKAHASHI

It is certified that error appears in the above-indentified patent and that said Letters Patent is hereby corrected as shown below:

COLUMN 10:

Line 57, "claim 21," should read --claim 37,--.

Signed and Sealed this

Thirtieth Day of September, 1997

Attest:

BRUCE LEHMAN

*Attesting Officer*     *Commissioner of Patents and Trademarks*